(12) United States Patent  
Chen (10) Patent No.: US 7,385,405 B2  
(45) Date of Patent: Jun. 10, 2008

(54) CAPACITANCE PROBE FOR THIN DIELECTRIC FILM CHARACTERIZATION

(75) Inventor: Dong Chen, Tucson, AZ (US)

(73) Assignee: Veeco Instruments, Inc., Woodbury, NY (US)

( * ) Notice: Subject to any disclaimer, the term of this patent is extended or adjusted under 35 U.S.C. 154(b) by 0 days.

(21) Appl. No.: 11/334,952

(22) Filed: Jan. 19, 2006

(65) Prior Publication Data

US 2006/0183255 A1  Aug. 17, 2006

Related U.S. Application Data

(62) Division of application No. 11/006,478, filed on Dec. 6, 2004, now Pat. No. 7,001,785.

(51) Int. Cl.
*G01R 27/28* (2006.01)
*G01R 27/26* (2006.01)

(52) U.S. Cl. ................. 324/652; 324/658; 324/690

(58) Field of Classification Search ............. 324/652
See application file for complete search history.

(56) References Cited

U.S. PATENT DOCUMENTS

| RE32,457 | E  |   | 7/1987  | Matey |
|----------|----|---|---------|----------------|
| 5,065,103 | A  |   | 11/1991 | Slinkman |
| 5,514,337 | A  |   | 5/1996  | Groger |
| 5,700,953 | A  |   | 12/1997 | Hlady |
| 5,902,928 | A  |   | 5/1999  | Chen |
| 6,014,029 | A  | * | 1/2000  | Soto et al. ............ 324/664 |
| 6,072,313 | A  |   | 6/2000  | Li |
| 6,172,506 | B1 | * | 1/2001  | Adderton et al. ......... 324/458 |
| 6,318,159 | B1 |   | 11/2001 | Chen |
| 6,366,096 | B1 | * | 4/2002  | Talanov et al. ............ 324/633 |
| 6,388,452 | B1 |   | 5/2002  | Picciotto |
| 6,445,194 | B1 |   | 9/2002  | Adkisson |
| 6,459,280 | B1 |   | 10/2002 | Bhushan |
| 6,465,267 | B1 |   | 10/2002 | Wang |
| 6,472,236 | B1 |   | 10/2002 | Wang |
| 6,492,827 | B1 |   | 12/2002 | Mazur |
| 6,778,807 | B1 | * | 8/2004  | Martino et al. ............ 434/362 |
| 6,794,886 | B1 |   | 9/2004  | Chen |

(Continued)

FOREIGN PATENT DOCUMENTS

WO    WO 01/29568    *    4/2001

*Primary Examiner*—Andrew H. Hirshfeld
*Assistant Examiner*—Jeff Natalini
(74) *Attorney, Agent, or Firm*—Patterson, Thuente, Skaar & Christensen, P.A.

(57) ABSTRACT

A capacitance probe for thin dielectric film characterization provides a highly sensitive capacitance measurement method and reduces the contact area needed to obtain such a measurement. Preferably, the capacitance probe is connected to a measurement system by a transmission line and comprises a center conductive tip and RLC components between the center conductor and the ground of the transmission line. When the probe tip is in contact with a sample, an MIS or MIM structure is formed, with the RLC components and the capacitance of the MIS or MIM structure forming a resonant circuit. By sending a driving signal to the probe and measuring the reflected signal from the probe through the transmission line, the resonant characteristic of the resonant circuit can be obtained. The capacitance of the MIS or MIM structure is obtainable from the resonant characteristics and the dielectric film thickness or other dielectric properties are also extractable.

17 Claims, 8 Drawing Sheets

U.S. PATENT DOCUMENTS 6,850,050 B2 * 2/2005 Chandhok et al. ......... 324/71.1
7,001,785 B1 * 2/2006 Chen ........................... 438/10
7,087,186 B1 * 8/2006 Tidrow et al. ......... 252/62.9 R
7,116,115 B2 * 10/2006 Gianchandani et al. ..... 324/661

2002/0102748 A1 8/2002 Kwon
2002/0130674 A1 9/2002 Lagowski
2004/0004484 A1 * 1/2004 Talanov et al. ............. 324/633

* cited by examiner

Fig. 1 (Prior Art)

Figure 1:
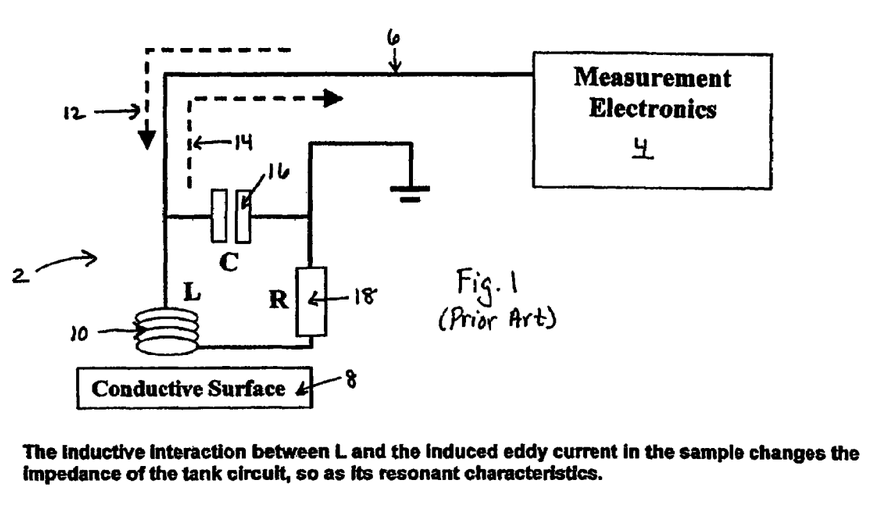
FIG. 1 is a prior art configuration of a tank probe for measuring surface conductance.

The inductive interaction between L and the induced eddy current in the sample changes the impedance of the tank circuit, so as its resonant characteristics.

Figures 3A, 3B, 3C:
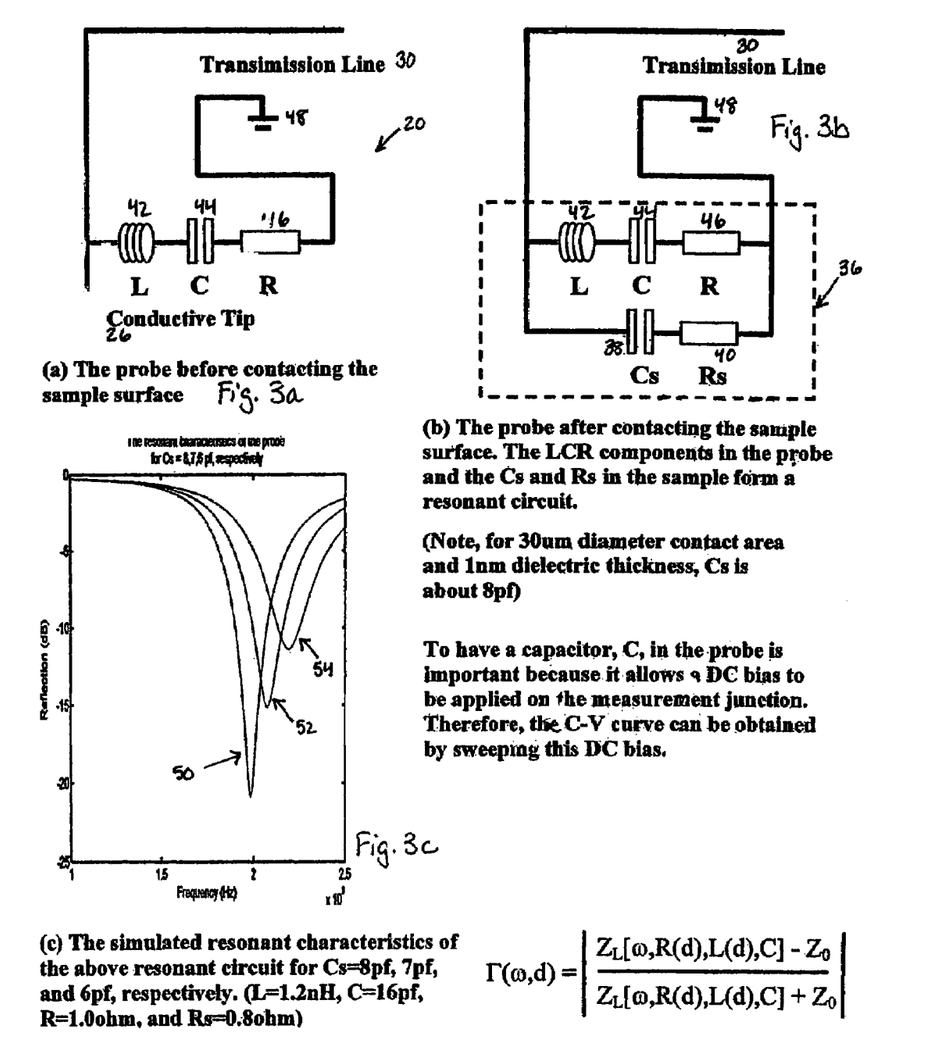
FIG. 3A is a diagram of a capacitance probe of the present invention prior to contacting a sample surface.
FIG. 3B is a diagram of the capacitance probe and sample surface of FIG. 3A after contact between the probe and the sample.
FIG. 3C is a graph of resonant characteristics of the probe of the present invention.

(a) The probe before contacting the sample surface   Fig. 3a (b) The probe after contacting the sample surface. The LCR components in the probe and the Cs and Rs in the sample form a resonant circuit.

(Note, for 30um diameter contact area and 1nm dielectric thickness, Cs is about 8pf)

To have a capacitor, C, in the probe is important because it allows a DC bias to be applied on the measurement junction. Therefore, the C-V curve can be obtained by sweeping this DC bias.

Fig. 3c (c) The simulated resonant characteristics of the above resonant circuit for Cs=8pf, 7pf, and 6pf, respectively. (L=1.2nH, C=16pf, R=1.0ohm, and Rs=0.8ohm)

$$\Gamma(\omega,d) = \left| \frac{Z_L[\omega,R(d),L(d),C] - Z_0}{Z_L[\omega,R(d),L(d),C] + Z_0} \right|$$

Figure 3D:
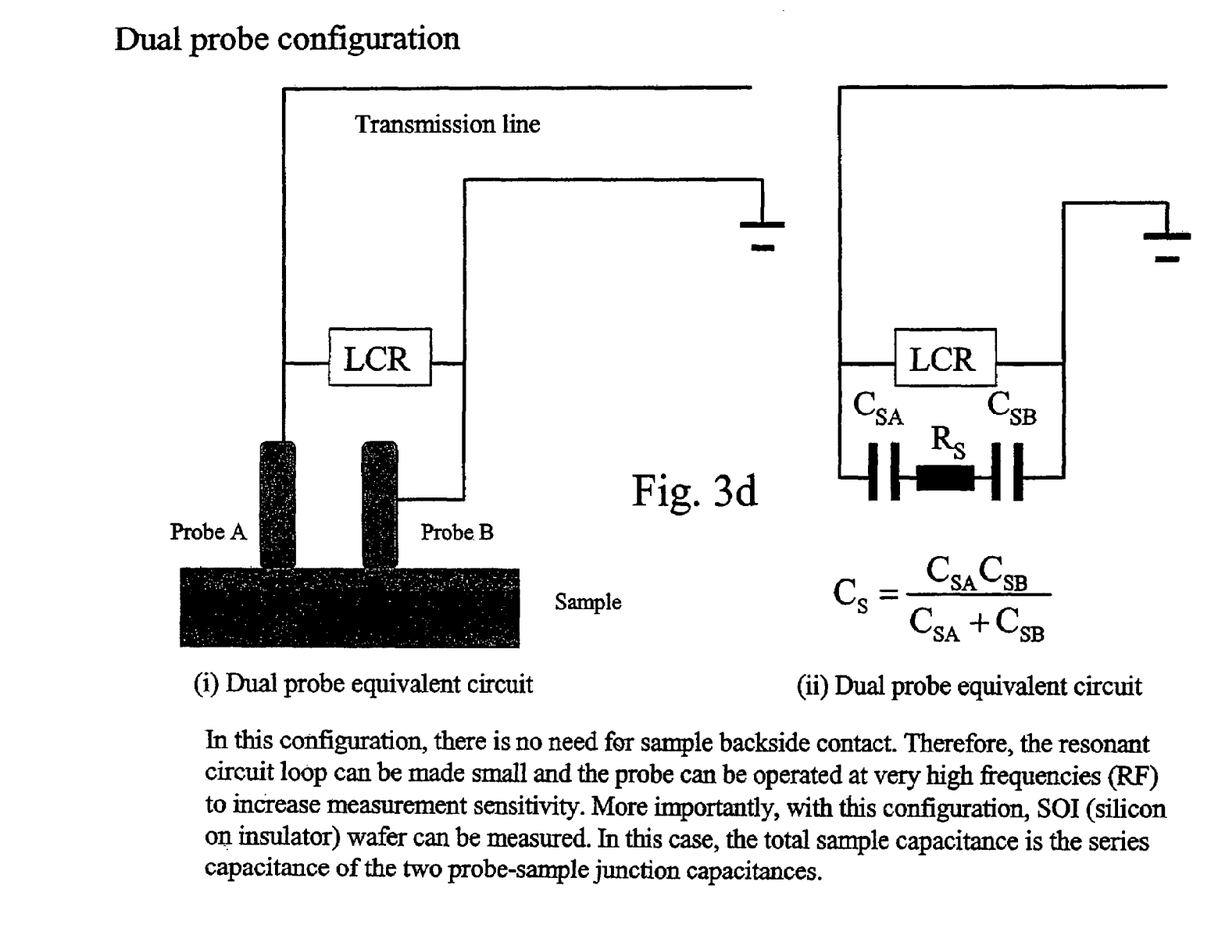
FIG. 3D is a diagram of a dual-probe configuration of the tank capacitance sensor of the present invention.

Fig. 3d (i) Dual probe equivalent circuit (ii) Dual probe equivalent circuit

In this configuration, there is no need for sample backside contact. Therefore, the resonant circuit loop can be made small and the probe can be operated at very high frequencies (RF) to increase measurement sensitivity. More importantly, with this configuration, SOI (silicon on insulator) wafer can be measured. In this case, the total sample capacitance is the series capacitance of the two probe-sample junction capacitances.

Dual-probe tank circuit can be integrated as a MEMS device to allow access small test area. The RLC components can be integrated in the probe sensor or connected externally.

Figure 3E:
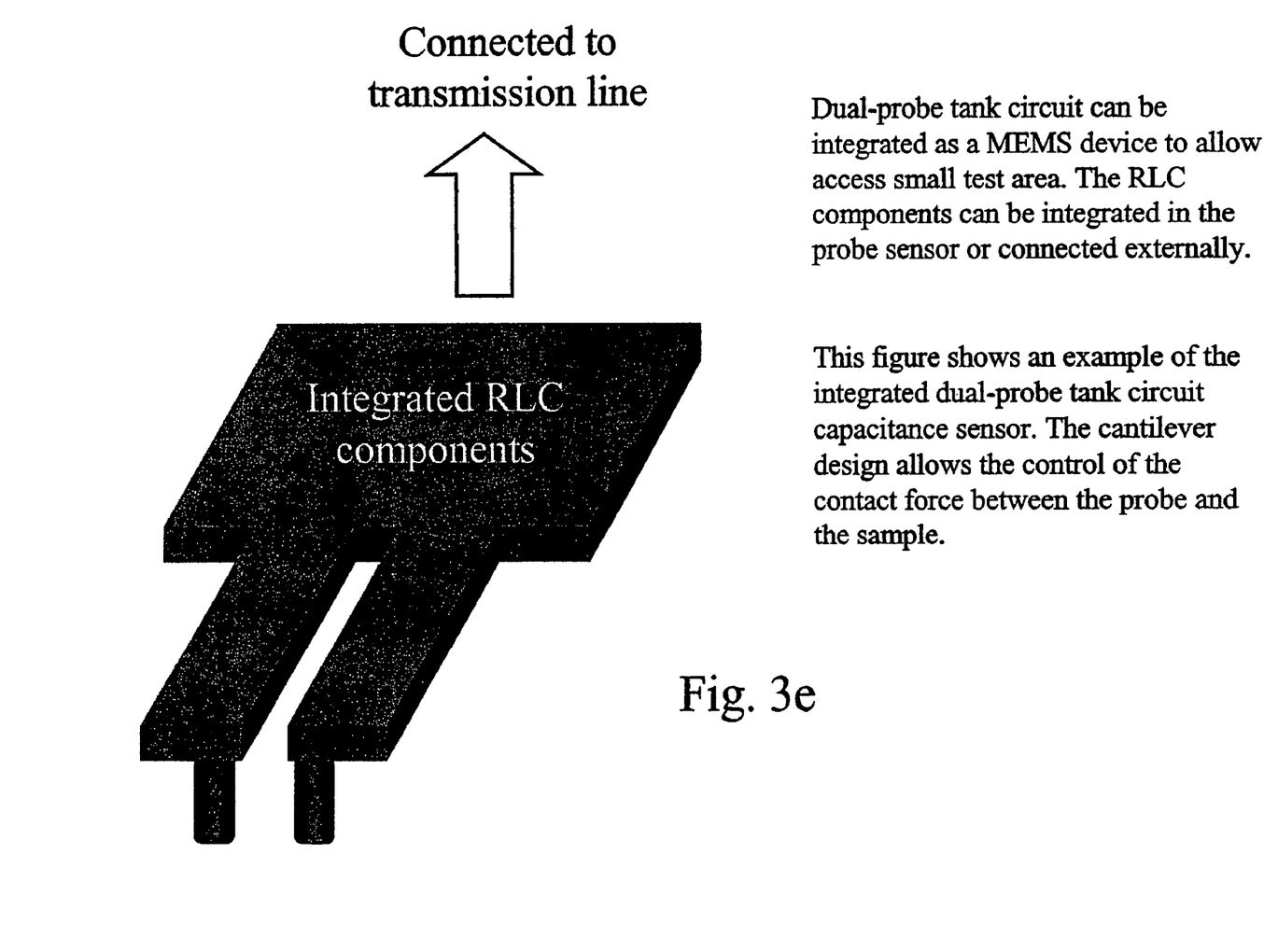
FIG. 3E shows an example of an integrated dual-probe tank capacitance sensor.

This figure shows an example of the integrated dual-probe tank circuit capacitance sensor. The cantilever design allows the control of the contact force between the probe and the sample.

Fig. 3e

Figures 4A, 4B:
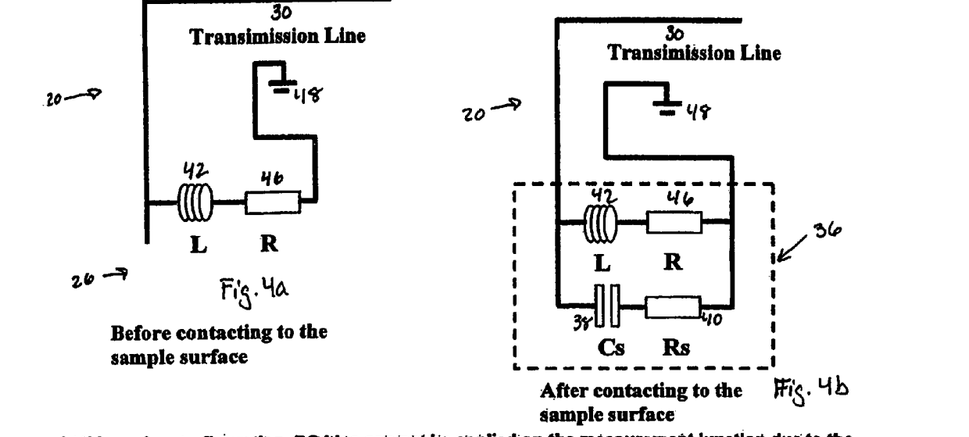
FIG. 4A is a diagram of an alternative embodiment of a capacitance probe of the present invention prior to contact between the probe and a sample surface.
FIG. 4B is a diagram of the capacitance probe of FIG. 4A after contact between the probe and the sample surface.

It is also possible to have the probe comprises only L and R components, as shown below.

Before contacting to the sample surface

Fig. 4a

After contacting to the sample surface

Fig. 4b

In this probe configuration, DC bias can not be applied on the measurement junction due to the shorting of LR brench. Therefore, the junction capacitance can be measured only in zero DC bias. However, the capacitance obtained with zero DC bias is contributed both from the dielectric film and the depletion layer of the underline semiconductor. In order to eliminate the contribution of semiconductor depletion layer, one can use photo illumination to flood the depletion layer while measuring the junction capacitance. The photo illumination will generate a surface photo voltage (SPV) that flattening potential across the depletion layer.

Before contacting to the sample surface

Fig. 4c

After contacting to the sample surface

Figure 5:
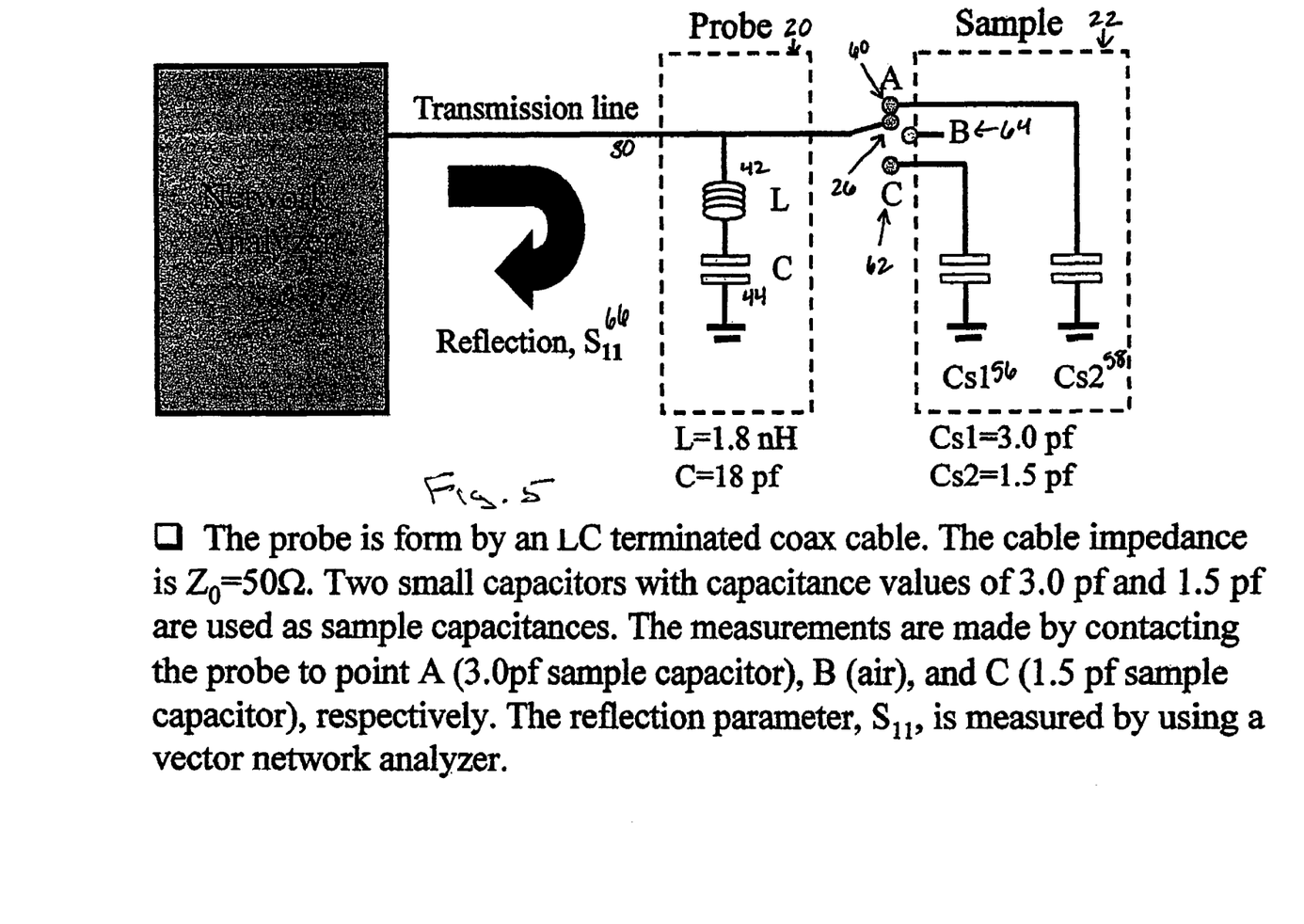
FIG. 5 is a diagram of a capacitance probe apparatus of the present invention.

☐ The probe is form by an LC terminated coax cable. The cable impedance is $Z_0=50\Omega$. Two small capacitors with capacitance values of 3.0 pf and 1.5 pf are used as sample capacitances. The measurements are made by contacting the probe to point A (3.0pf sample capacitor), B (air), and C (1.5 pf sample capacitor), respectively. The reflection parameter, $S_{11}$, is measured by using a vector network analyzer.

Figure 6A:
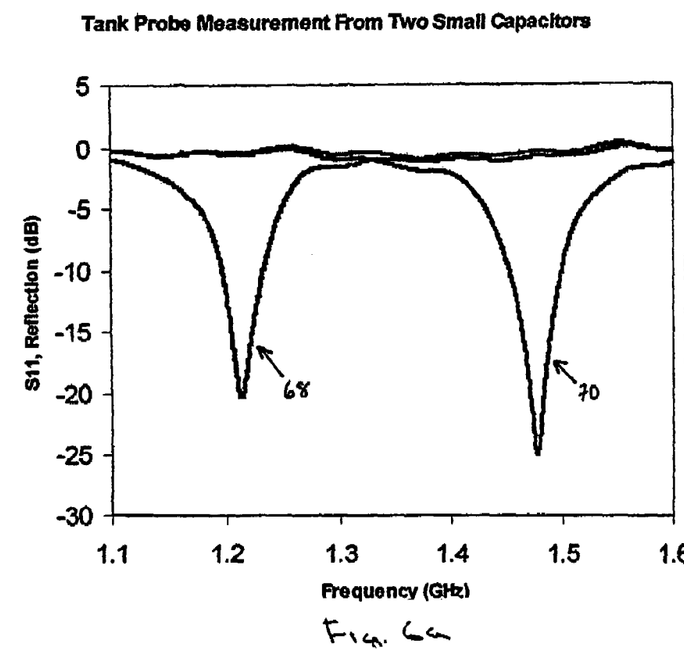
FIG. 6A is a graph of tank probe measurements from two capacitors.
Figure 6B:
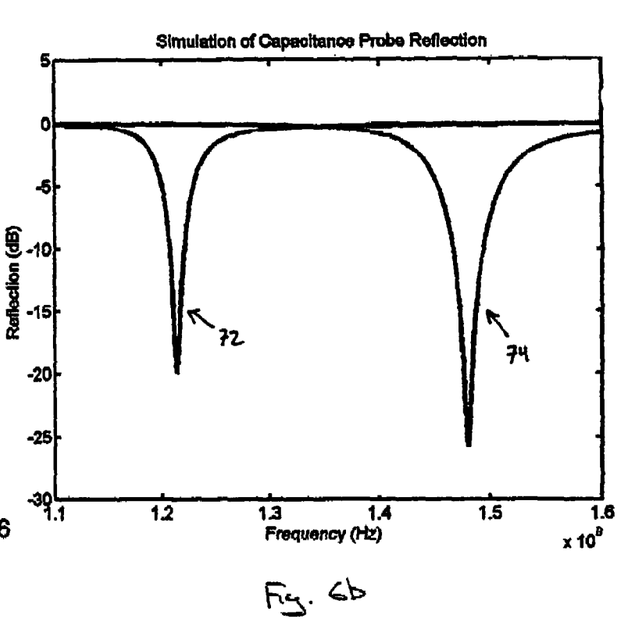
FIG. 6B is a graph of a simulation of capacitance probe reflections of the present invention for the same capacitor values as FIG. 6A.

☐ Comparison between the measured and the calculated curves for the two capacitance resonances.

CAPACITANCE PROBE FOR THIN DIELECTRIC FILM CHARACTERIZATION

RELATED APPLICATION

This application is a divisional of application Ser. No. 11/006,478 filed Dec. 6, 2004, now U.S. Pat. No. 7,001,785.

FIELD OF THE INVENTION

The present invention generally relates to the field of film characterization in semiconductor devices. In particular, the present invention relates to a capacitance probe for use with a scanning probe microscope in determining a dielectric film thickness in semiconductor devices.

BACKGROUND OF THE INVENTION

The industry of semiconductor manufacturing involves highly complex techniques for integrating circuits into semiconductor materials. Multiple fine layers of metals and materials form these integrated circuits. To increase the speed and performance of devices utilizing integrated circuits, the size of semiconductor devices must be decreased. Due to the large scale of circuit integration and the decreasing size of semiconductor devices, the semiconductor manufacturing process is prone to processing defects. When the dimensions of semiconductor devices are decreased, the thickness of the various layers of metals and materials must be controlled more and more accurately. As semiconductor device film layer thickness approaches a few atomic levels, existing techniques for monitoring and measuring this dimension become very challenging due to measurement sensitivity scale. For example, measuring the thickness of a sheet of paper with a scale no finer than an inch is next to impossible; the difference in scale is too great to make a meaningful and accurate measurement.

Testing procedures and measurement scale are therefore critical to maintaining quality control and accurately testing and measuring semiconductor devices. Because the testing procedures are an integral and significant part of the manufacturing process, the semiconductor industry constantly seeks more accurate and efficient testing procedures. Increasingly, this requires seeking testing procedures that are accurate and efficient at extremely small dimensions.

There are several methods currently used to characterize thin dielectric films. For example, scanning force microscopes are known in the art. U.S. Pat. No. 5,902,928 to Chen et al., entitled, "Controlling Engagement of a Scanning Microscope Probe with a Segmented Piezoelectric Actuator," discloses a scanning probe microscope that includes a segmented piezoelectric actuator having a course segment and a fine segment, the outputs of which are combined to determine the movement of a distal end of the actuator, to which the probe is mechanically coupled.

In U.S. Pat. No. 6,318,159 to Chen et al., entitled, "Scanning Force Microscope with Automatic Surface Engagement," the vibrating probe of a scanning force microscope is brought into engagement with a sample surface in an initial approach process moving the probe toward the sample surface until the amplitude of probe vibration at an excitation frequency is measurably affected by forces between the tip and the sample, and then in a final approach process in which a change in vibration amplitude caused by a dithering vibration superimposed on the excitation vibration exceeds a predetermined threshold limit. During approach and scanning, vibration amplitude is measured through a demodulator having an intermediate reference signal locked in phase with the tip motion signal.

U.S. Pat. No. 5,065,103 to Slinkman et al., entitled, "Scanning Capacitance—Voltage Microscopy," discusses an apparatus and method for generating microscopic scan data of C-V and/or dC/dV over a scan area. A scanning microscope is provided with a voltage biased tip that is scanned across an area to derive the data and the data can then be used to derive a plot of semiconductor dopant level across the scan area.

A method for mapping a mechanical property of a surface of a sample with a scanning force microscope is described in U.S. Pat. No. 5,700,953 to Hlady et al. The method comprises the steps of: (a) scanning a fine tip supported on a cantilever beam in contact with the surface of a sample; (b) applying a loading force on the surface of the sample by the fine tip; (c) oscillating the cantilever beam relative to the surface of the sample; (d) measuring a detector response of the fine tip; (e) determining the amplitude and a change in phase angle of the detector response; and (f) relating the amplitude and the change in phase angle to a property of the surface of the sample.

A "Scanning Capacitance Microscope" is described in U.S. Patent No. Re. 32,457 to Matey. Variations in topography and material properties of the surface layer of a body are observed in microscopic imaging using a scanning capacitance probe.

Mazur et al., discloses a "Non-Invasive Electrical Measurement of Semiconductor Wafers," in U.S. Pat. No. 6,492,827. A semiconductor wafer probe assembly includes a chuck assembly configured to receive a back surface of a semiconductor wafer and an electrical contact for contacting the semiconductor wafer. A probe having an elastically deformable conductive tip is movable into contact with a semiconducting material forming a front surface of the semiconductor wafer or with a front surface of a dielectric formed on the front surface of the semiconducting materials. A tester is connected for applying an electrical stimulus between the electrical contact and the conductive tip for measuring a response to the electrical stimulus and for determining from the response at least one electrical property of the semiconducting material and/or the dielectric.

U.S. Pat. No. 6,172,506 to Adderton et al., entitled, "Capacitance Atomic Force Microscopes and Methods of Operating Such Microscopes," discloses scanning a surface of a sample in intermittent contact mode with an atomic force microscope where the probe tip is electrically conductive and is electrically connected to a capacitance sensing circuit. The oscillation of the atomic force microscope probe modulates capacitance between probe tip and sample surface and the modulated capacitance is demodulated to yield the capacitance properties of the sample.

Other methods for characterizing thin dielectric films are also known in the art. In U.S. Pat. No. 6,459,280 to Bhushan et al., capacitive film thickness measurement devices and measurement systems are described, including a device and technique for determining film thickness by suspending the film in a liquid dielectric. U.S. Patent Application Pub. No. 2002/0130674, discloses a steady state method for measuring the thickness and the capacitance of ultra thin dielectric in the presence of substantial leakage current. U.S. Pat. No. 6,388,452 to Picciotto, entitled, "Device for Sensing Media Thickness Using Capacitance Measurements," discloses deriving the thickness of a media by electronically measuring the capacitance between the first and second electrodes of a variable capacitance capacitor. U.S. Pat. No. 6,465,267 to Wang et al., describes a "Method of Measuring Gate Capacitance to Determine the Electrical Thickness of Gate Dielectrics," by connecting a meter to an integrated circuit gate structure and an active region located proximate the integrated circuit gate structure, applying forward body bias to the transistor at a gate inversion measuring point, and measuring capacitance from the meter while the transistor receives the forward body bias. U.S. Pat. No. 6,445,194 to Adkisson et al., describes a "Structure and Method for Electrical Method of Determining Film Conformality," and, in particular, for measuring the sidewall deposition thickness of dielectric films.

There are several drawbacks associated with the methods of the prior art. It is frequently difficult to obtain consistent measurement data. The probe methods of the prior art often are not highly sensitive, requiring a larger contact area that increases the chance of damaging the sample and also reduces the accuracy of the measurements. In addition, scanning capacitance microscopes are often sensitive to the change of capacitance when stimulated with an ac bias, i.e., dC/dV.

In light of the foregoing, a capacitance probe for thin dielectric film characterization that is highly sensitive and obtains consistent measurement data is desirable.

SUMMARY OF THE INVENTION

The present invention is a conductive probe having LCR (resistor, indicator and capacitor) components at the end of a transmission line. The LCR components and a measured sample form an LCR resonator. The resonant frequency of the resonator is a function of the capacitance of the measured junction structure. By measuring the resonant characteristic of the probe, the capacitance of the sample can be obtained and the dielectric film thickness can be extracted.

In a preferred embodiment, a conductive probe is connected to the end of a center conductor of a coaxial cable or transmission line. RLC components are connected between the center probe and the ground of the coaxial cable or transmission line. When the center conductive probe is brought in contact with the sample surface, it forms an MIS or MIM structure. When the substrate is in the same ground as the transmission line, the RLC components at the end of the transmission line and the capacitance of the MIS/MIM structure form a resonant circuit. The resonant frequency of this resonant circuit is a function of the MIS/MIM capacitance. When this probe is driven by a signal generator, the reflected signal from the probe through the transmission line can be used to determine the resonant characteristics of the resonant circuit. Therefore, the MIS/MIM capacitance can be measured and the dielectric film thickness or its dielectric properties can be extracted.

The objects of the present invention include characterization of thin dielectric film on semiconductor or metal substrate using a conductive probe to form metal-insulator-semiconductor (MIS) or a metal-insulator-metal (MIM) structures and using a probe circuit with inductor, capacitor, and resistor (LCR) components at the end of a transmission line as a signal reflector for capacitance measurement on these structures.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

The capacitance probe for thin dielectric film characterization of the present invention provides a highly sensitive capacitance measurement method and reduces the contact area needed to obtain such a measurement. A preferred embodiment of the capacitance probe of the present invention is connected to a measurement system by a transmission line and comprises a center conductive tip and LCR components between the center conductor and the ground of the transmission line. When the probe tip is in contact with a sample, an MIS or MIM structure is formed, with the LCR components and the capacitance of the MIS or MIM structure forming a resonant circuit. By sending a high frequency driving signal to the probe and by measuring the reflected signal from the probe through the transmission line, the resonant characteristic of the resonant circuit can be obtained because the reflected signal has minimum power at the resonant frequency of the probe circuit. The capacitance of the MIS or MIM structure can be obtained from the resonant characteristics and the dielectric film thickness or other dielectric properties can be extracted.

FIG. 1 is a prior art sketch of a tank probe circuit 2 for measuring surface conductance. The probe circuit 2 comprises an inductor 10, a capacitor 16, and a resistor 18 and is connected to a measurement system 4 via a transmission line 6. The measurement system 4 sends a driving signal 12 to the tank probe circuit 2 and measures the reflected signal from the probe. When the probe 2 is brought near a conductive surface 8 of a sample, the induced eddy current generated in the conductive sample interacts with the inductor 10 of the probe circuit 2 and changes the inductor's 10 impedance. This impedance change alters the intensity of the reflected signal and the resonant frequency of the circuit 2. The measurement system 4 then measures the change in the intensity of the reflected signal 14 and the resonant frequency shift of the tank probe 2.

Figures 2A, 2B:
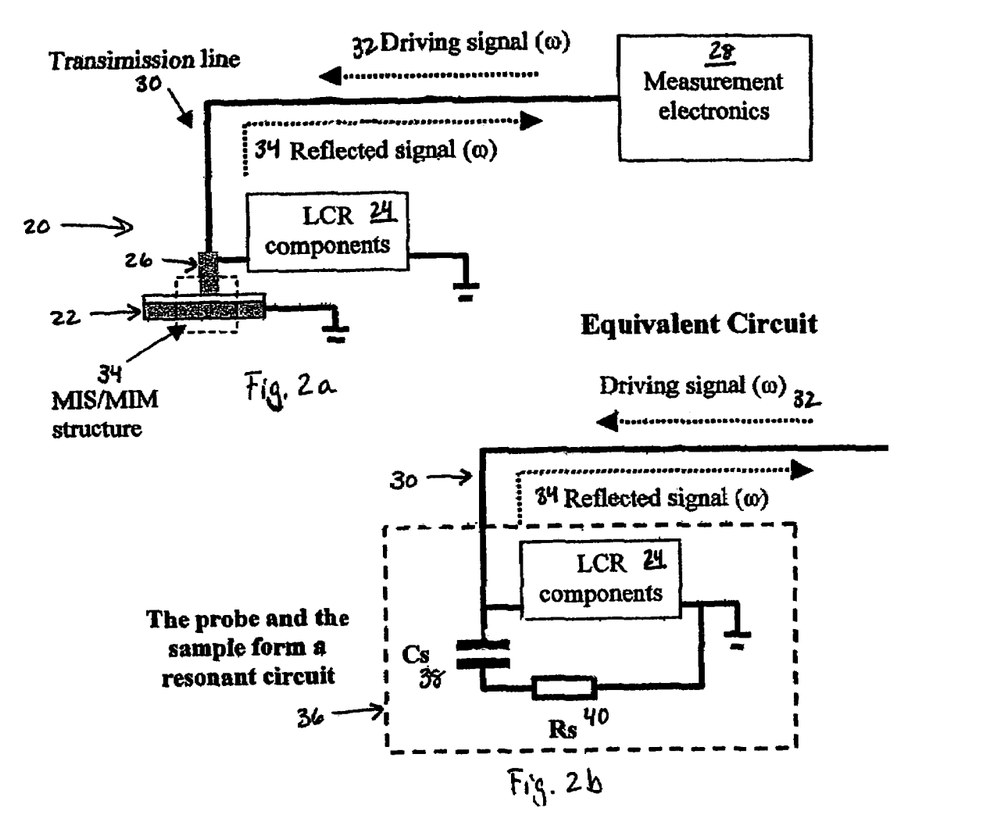
FIG. 2A is a diagram of a sample and a capacitance probe of the present invention.
FIG. 2B is a diagram of an equivalent circuit of the sample and capacitance probe of FIG. 2A.

FIG. 2A is a diagram of a sample 22 and a capacitance probe 20 of the present invention. The capacitance probe 20 comprises LCR components 24 and a probe tip 26. The capacitance probe 20 is connected to measurement electronics 28 via a transmission line 30. The measurement electronics 28 sending a driving signal 32 to the capacitance probe. The probe tip 26 contacts the surface of the sample 22, forming an MIS or MIM structure 34. FIG. 2B is a diagram of an equivalent circuit of the sample 22 and capacitance probe 20 of FIG. 2A after contact. The LCR components 24 and the sample 22 form a resonant circuit 36, where Cs 38 is a capacitance of the sample 22 and Rs 40 is a resistance of the sample 22. The resonant frequency of the resonant circuit 36 is a function of the capacitance of the measured junction structure 34. The measurement electronics 28 receive a reflected signal 34 from the resonant circuit 36 and measure the resonant characteristic of the probe 20. The capacitance of the sample can be obtained from this measurement and the dielectric film thickness can then be extracted.

FIG. 3A is a diagram of a capacitance probe 20 of the present invention prior to contacting a sample surface. The capacitance probe 20 comprises LCR components 24 (see FIGS. 2A and 2B) and the conductive tip 26 connected to the transmission line 30. The LCR components 24 comprise an inductor 42, a capacitor 44, and a resistor 46 connected between the transmission line 30 and ground 48.

FIG. 3B is a diagram of the capacitance probe 20 and sample surface of FIG. 3A after contact between the probe 20 and the sample. The probe 20 and sample form a resonant circuit 36, where a sample capacitance 38 and sample resistance 40 are connected in parallel with the inductance 42, capacitance 44, and resistance 46 of the probe 20. The capacitor 44 of the probe is important as it allows a DC bias to be applied on the measurement junction. A C-V curve can then be obtained by sweeping this DC bias.

FIG. 3C is a graph of simulated resonant characteristics of the resonant circuit 36 of the present invention. The first curve 50 is with Cs 38=8 picofarads. The second curve 52 is with Cs 38=7 picofarads. The third curve 54 is with Cs 38=6 picofarads. In the above simulation, L 42=1.2 nano Henrys, C 44=16 picofarads, R 46=1.0 Ohm, and Rs 40=0.8 Ohms, and the following equation is used:

$$\Gamma(\omega) = \left| \frac{Z_L(\omega, R_p, L_p, C_p, R_s, L_s, C_s) - Z_0}{Z_L(\omega, R_p, L_p, C_p, R_s, L_s, C_s) + Z_0} \right| \quad \text{Equation (1)}$$

Here, $\Gamma(\omega)$ is the reflection coefficient of the driving signal reflecting from the tank probe which is the function of frequency $\omega$. $Z_L$ is the tank probe's impedance which is the function of probe's resistance, $R_p$, inductance, $L_p$, capacitance, $C_p$, and the sample's resistance, $R_s$, inductance, $L_s$, capacitance, $C_s$. Z0 is the characteristic impedance of the transmission line, usually has a value of 50 ohms. $\Gamma(\omega)$ is near one when the frequency $\omega$ is far away from the resonant frequency of the tank probe (almost all the driving signal power is reflected from the probe). However, at the tank probe's resonant frequency, the reflected power is minimum as shown in FIG. 3C.

FIG. 3D is a diagram of a dual-probe configuration of the tank capacitance sensor of the present invention. In this configuration, two probes, one connected to the center conductor of the transmission line and another connected to the ground of the transmission line with LCR components between them, contact the sample surface and form two probe-sample junction. Therefore, the sample capacitance in the tank resonant loop is the series capacitance of the two probe-sample junction capacitances. In this configuration, there is no need for sample backside electrical contact. The tank resonant loop size can be made very small and allow the probe be operated at very high frequency (RF). This helps to increase the measurement sensitivity of the technique. More importantly, with this configuration, SOI (Silicon On Insulator) wafer can be measured. In this case, the total sample capacitance is the series capacitance of the two probe-sample junction capacitances.

These tank capacitance probes can be integrated as a MEMS device to allow access small test area. FIG. 3E shows an example of an integrated dual-probe tank capacitance sensor. The RCL components can be integrated in the probe sensor or can be connected externally. The cantilever design allows the control of the contact force between the probe and the sample.

Figure 4C:
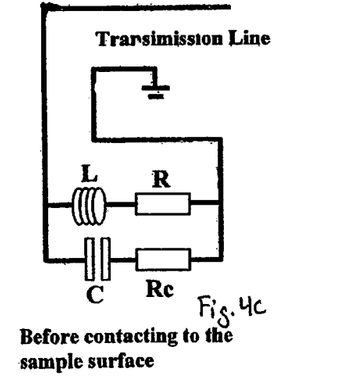
FIG. 4C is a diagram of a further alternative embodiment of a capacitance probe of the present invention prior to contact between the probe and a sample surface.
Figure 4D:
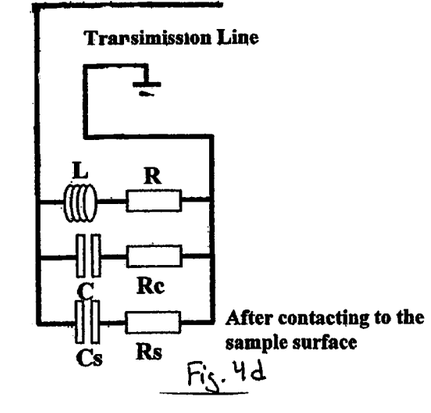
FIG. 4D is a diagram of the capacitance probe of FIG. 4C after contact between the probe and the sample surface.

FIG. 4A is a diagram of an alternative embodiment of a capacitance probe of the present invention prior to contact between the probe and a sample surface. In this alternative embodiment, the probe 20 comprises only an inductor 42 and a resistor 46 and does not include a capacitor. FIG. 4B is a diagram of the capacitance probe 20 of FIG. 4A after contact between the probe tip 26 and the sample surface. In this embodiment, DC bias cannot be applied on the measurement junction because of the shorting of the LR branch. Therefore, the junction capacitance can be measured only in zero DC bias. The capacitance obtained with zero DC bias, however, results both from the dielectric film and the depletion layer of the underlying semiconductor. To eliminate the capacitive contribution of the semiconductor depletion layer, photo illumination can be used to flood the depletion layer while measuring the junction capacitance. The photo illumination will generate a surface photo voltage that flattens the potential across the depletion layer. FIG. 4C is a diagram of another example of the capacitance probe prior to contact the sample surface. In this example embodiment, the probe itself is an LCR resonant circuit. FIG. 4D is a diagram of the capacitance probe of this example embodiment after contacting the sample surface where the sample's capacitance $C_s$ and resistance $R_S$ alter the probe's impedance, and thus its resonant frequency.

FIG. 5 is a diagram of a capacitance probe apparatus of the present invention. The probe 20 is connected to measurement electronics (network analyzer) 28 via a transmission line 30. The probe 20 is formed by an inductor 42 and capacitor 44 terminated coaxial cable (the transmission line) 30. The impedance of the cable 30 is $Z_0$=50 Ohms. Two small capacitors, Cs1 56 and Cs2 58, are used as sample 22 capacitances, where Cs1 56=3.0 picofarads and Cs2 58=1.5 picofarads. Measurements are made by contacting the probe 20, more particularly the probe tip 26, to points A 60 (Cs2 58), B 64 (air) and C 62 (Cs1 56). The reflection parameter, $S_{11}$ 66, is measured using a vector network analyzer (measurement electronics) 28.

FIG. 6A is a graph of the probe resonant curves measured from the capacitance probe apparatus of FIG. 5. FIG. 6B is a graph of a simulation of capacitance probe reflections of the present invention for the same capacitor values as FIG. 6A. A comparison of the measured results of FIG. 6A with the calculated curves of FIG. 6B for the two capacitance resonances of FIG. 5 shows that the simulated curve 72 for a 3.0 picofarad capacitor is nearly identical to the measured curve 68 for Cs1 56. The simulated curve 74 for a 1.5 picofarad capacitor is also nearly identical to the measured curve 70 for Cs2 58.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed is:

1. A probe for a scanning probe microscope, the probe comprising:
    a transmission guide having a first end and a second end;
    a probe tip situated proximate to the first end of the transmission guide;
    a resonant circuit comprising at least an inductor and a capacitor that collectively provide inductive, capacitive and resistive characteristics, wherein the resonant circuit is situated substantially at the probe tip and is electrically connected to the transmission guide at the first end, and wherein at least a portion of a total capacitance of the resonant circuit is attributable to a capacitance of the probe in electrical combination with a sample via the probe tip; and
    a signal generator that injects a signal into the second end of the transmission guide; and
    a signal analyzer that analyzes the signal at the second end of the transmission guide to determine the capacitance of the electrical combination of the probe tip and the sample based on a reflection of the signal from the first end of the transmission guide.

2. The probe of claim 1, wherein in operation, the probe tip is electrically coupled with the sample at a contact area.

3. An apparatus for measuring a characteristic of a sample comprising:
    a resonant sensor having
        a conducting probe that includes a probe tip, the conducting probe being adapted to electrically probe a microelectronic structure; and
        circuit components having resistive, inductive, and capacitive characteristics and including at least an inductor and a capacitor situated substantially at and operably connected to said probe tip;
    wherein the resonant sensor is constructed such that a resonant circuit is formed by a combination of the circuit components and a capacitance of the probe tip when the probe tip makes electrical contact with the sample.

4. The apparatus of claim 3, further comprising:
    measurement electronics that operate to determine the characteristic of the sample based on the capacitance of the probe tip in electrical contact with the sample, wherein the characteristic of the sample is at least one sample characteristic selected from the set consisting of: capacitance, thickness and dielectric constant.

5. The apparatus of claim 3, further comprising:
    measurement electronics that inject a variable frequency signal into the sample via the probe tip.

6. The apparatus of claim 3, wherein the probe tip is configured such that, when the probe tip is in electrical contact with the sample, a separation between the circuit components and the sample is less than 2 millimeters.

7. The apparatus of claim 3, further comprising:
    measurement electronics electrically coupled to the probe tip, wherein the measurement electronics measure a reflectance of a signal applied through the probe tip to determine a characteristic of the sample.

8. The apparatus of claim 3, further comprising:
    measurement electronics that operate to determine the capacitance of the probe tip in electrical contact with the sample.

9. The apparatus of claim 3, wherein the probe tip comprises a microelectromechanical system (MEMS) device that includes at least a portion of the circuit components.

10. The apparatus of claim 3, further comprising a transmission line electrically coupled at a first end to the resonant sensor and electrically coupled at a second end to measurement electronics adapted to apply a driving signal to the resonant sensor via the transmission line and to measure a response of the resonant circuit to the driving signal via the transmission line.

11. The apparatus of claim 10, wherein the measurement electronics include a vector network analyzer that applies the driving signal and measures the response of the resonant circuit to produce a signal indicative of a resonance frequency of the resonant circuit.

12. The apparatus of claim 10, wherein in operation, a frequency range of the driving signal and a proximity of the circuit components with the sample are such that the driving signal, when applied to the second end of the transmission line, experiences substantially a single reflection associated with the resonant sensor at the first end of the transmission line.

13. The apparatus of claim 3, wherein the circuit components include a resistor electrically coupled with the inductor and capacitor components and situated at the probe tip.

14. The apparatus of claim 3, wherein the circuit components are electrically coupled with the probe tip to permit a DC bias to be applied to the sample via the probe tip.

15. The apparatus of claim 3, wherein the circuit components are electrically coupled with the probe tip in a parallel configuration such that:
    a first signal path through the conducting probe includes the circuit components and bypasses the probe tip; and
    a second path through the conducting probe includes the probe tip and bypasses the circuit components.

16. An apparatus for measuring a characteristic of a sample comprising:

a resonant sensor having a conducting probe that includes a probe tip, the conducting probe being adapted to electrically probe a microelectronic structure; and means for establishing an electrical resonance substantially at the probe tip; and wherein the apparatus further comprises means for forming a new resonant circuit using an electrical connection between the probe tip and the sample.

17. The apparatus of claim 16, wherein the means for establishing an electrical resonance proximate to the probe tip include a tank circuit integrated with the probe as a MEMS device.

* * * * *